(12) United States Patent
Baptist et al.

(10) Patent No.: US 8,726,120 B2
(45) Date of Patent: May 13, 2014

(54) STORING ENCODED DATA SLICES IN A DISPERSED STORAGE UNIT

(71) Applicant: Cleversafe, Inc., Chicago, IL (US)

(72) Inventors: Andrew Baptist, Mt. Pleasant, WI (US); Ilya Volvovski, Chicago, IL (US); Wesley Leggette, Chicago, IL (US); Greg Dhuse, Chicago, IL (US); Jason K. Resch, Chicago, IL (US)

(73) Assignee: Cleversafe, Inc., Chicago, IL (US)

( * ) Notice: Subject to any disclaimer, the term of this patent is extended or adjusted under 35 U.S.C. 154(b) by 0 days.

(21) Appl. No.: 14/046,089

(22) Filed: Oct. 4, 2013

(65) Prior Publication Data

US 2014/0040703 A1    Feb. 6, 2014

Related U.S. Application Data

(63) Continuation of application No. 13/252,340, filed on Oct. 4, 2011.

(51) Int. Cl.
*H03M 13/00* (2006.01)
*G11C 29/00* (2006.01)
*G06F 11/00* (2006.01)
*G06F 13/00* (2006.01)
*G06F 15/16* (2006.01)
*G06F 12/00* (2006.01)

(52) U.S. Cl.
USPC ............ 714/752; 714/763; 714/769; 714/770; 714/773; 714/799; 714/702; 714/6.1; 714/6.2; 714/6.22; 714/6.24; 714/42; 711/111; 711/114; 711/170; 709/231; 707/822

(58) Field of Classification Search
USPC ......... 714/702, 718, 751, 752, 763, 769, 770, 714/773, 799, 6.1, 6.2, 6.22, 6.24, 42; 711/111, 114, 170; 709/231; 707/822
See application file for complete search history.

(56) References Cited

U.S. PATENT DOCUMENTS

| | | | |
|---|---|---|---|
| 2010/0146191 A1* | 6/2010 | Katz | 711/103 |
| 2011/0029809 A1* | 2/2011 | Dhuse et al. | 714/6 |
| 2011/0072210 A1* | 3/2011 | Dhuse | 711/114 |
| 2011/0072321 A1* | 3/2011 | Dhuse | 714/55 |
| 2012/0054500 A1* | 3/2012 | Dhuse et al. | 713/189 |
| 2012/0254691 A1* | 10/2012 | Resch et al. | 714/763 |
| 2012/0311395 A1* | 12/2012 | Leggette et al. | 714/752 |
| 2013/0013959 A1* | 1/2013 | Grube et al. | 714/6.2 |
| 2013/0047057 A1* | 2/2013 | Resch et al. | 714/799 |
| 2013/0086450 A1* | 4/2013 | Grube et al. | 714/763 |
| 2013/0086451 A1* | 4/2013 | Grube et al. | 714/763 |

* cited by examiner

*Primary Examiner* — John J Tabone, Jr.
(74) *Attorney, Agent, or Firm* — Garlick & Markison; Timothy W. Markison

(57) ABSTRACT

A method begins with a processing module receiving an access request for the data object. The method continues by ascertaining that the data object is divided into a plurality of data segments and that plurality of data segments are dispersed storage error encoded to produce a plurality of sets of encoded data slices. The method continues by ascertaining batching of the plurality of sets of encoded data slices, wherein the plurality of sets of encoded data slices are arranged into a set of batched encoded data slices. The method continues by outputting a set of access requests for the set of batched encoded data slices to storage units of the DSN.

10 Claims, 9 Drawing Sheets computing system 10

STORING ENCODED DATA SLICES IN A DISPERSED STORAGE UNIT

CROSS REFERENCE TO RELATED PATENTS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 13/252,340, entitled "STORING ENCODED DATA SLICES IN A DISPERSED STORAGE UNIT," filed Oct. 4, 2011, now U.S. Pat. No. 8,555,130.

STATEMENT REGARDING FEDERALLY SPONSORED RESEARCH OR DEVELOPMENT

This invention was made with Government support under Contract No. 2009*0674524*000 awarded by the Central Intelligence Agency. The Government has certain rights in the invention.

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to computing systems and more particularly to data storage solutions within such computing systems.

2. Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to utilize a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failures issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

DETAILED DESCRIPTION OF THE INVENTION

Figure 1:
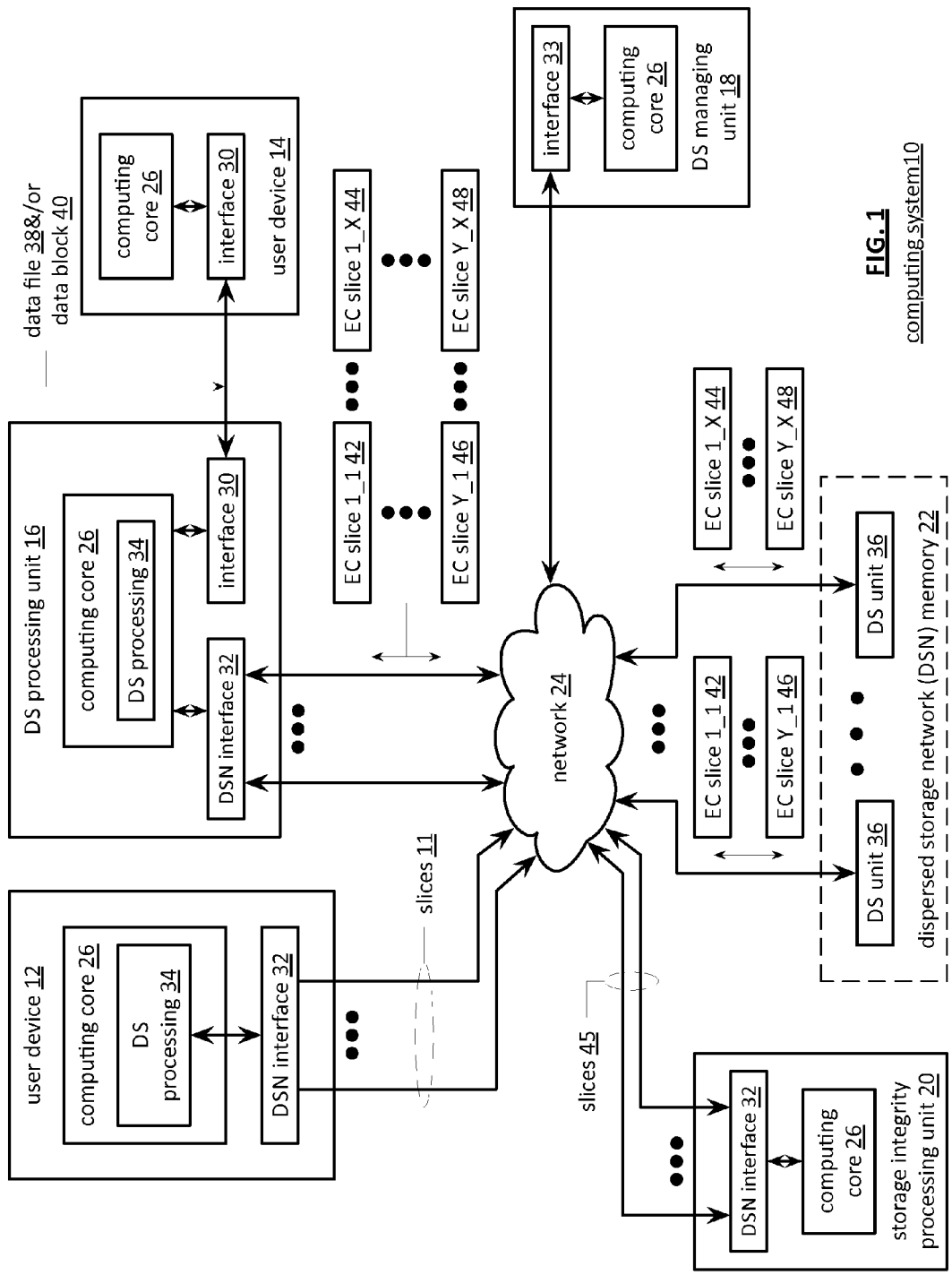
FIG. 1 is a schematic block diagram of an embodiment of a computing system in accordance with the invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-12.

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interfaces 30 support a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing module 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices and/or unit's activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it send the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each slice 42-48, the DS processing unit 16 creates a unique slice name and appends it to the corresponding slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the slices 42-48 for transmission via the network 24.

The number of DS units 36 receiving the slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improved data storage integrity and security. Further examples of encoding the data segments will be provided with reference to one or more of FIGS. 2-12.

Each DS unit 36 that receives a slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuild slice, or slices, in the appropriate DS unit(s) 36 in a manner that mimics the write process previously described.

Figure 2:
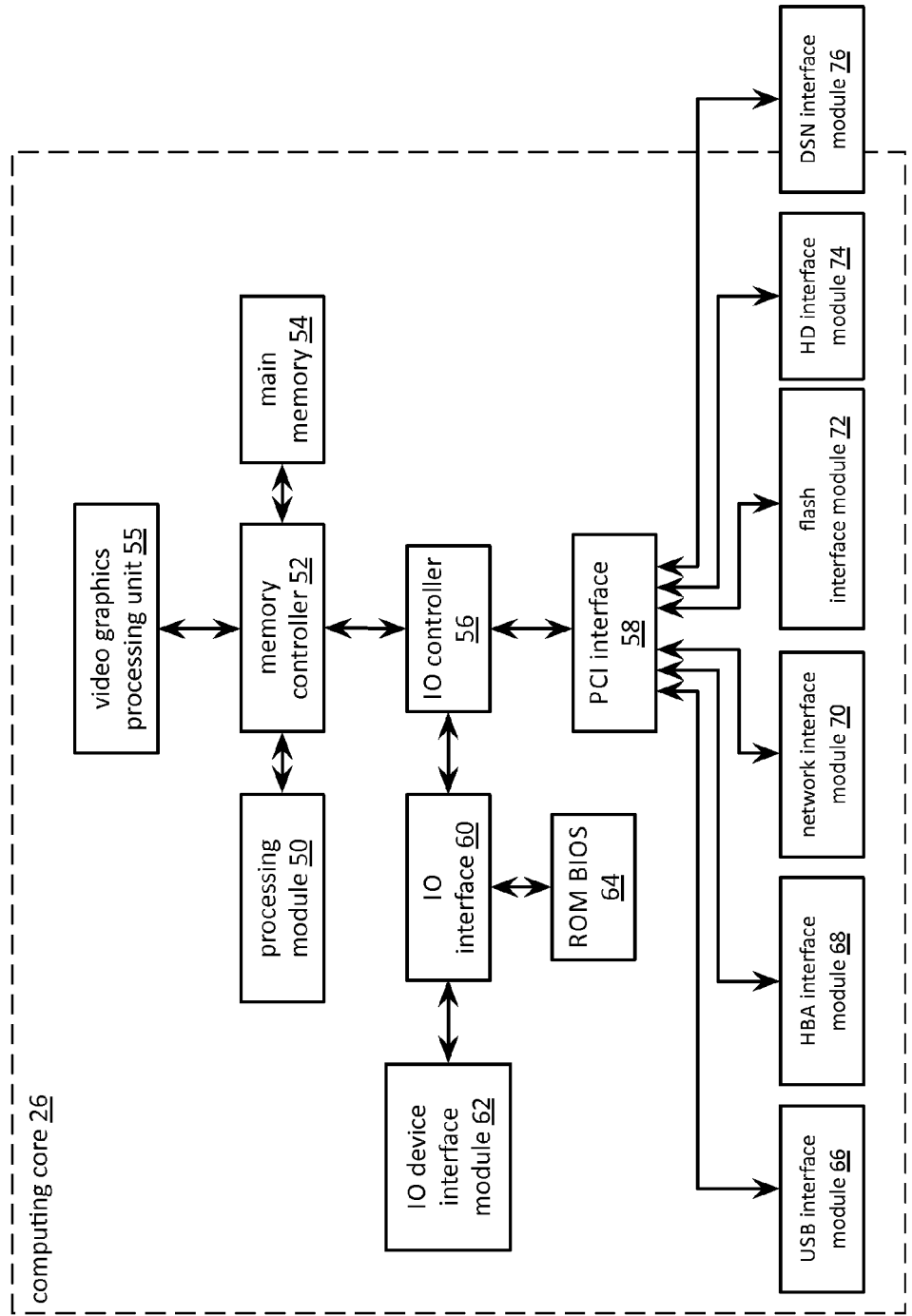
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the TO device interface module 62 and/or the memory interface modules may be collectively or individually referred to as TO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-12.

Figure 3:
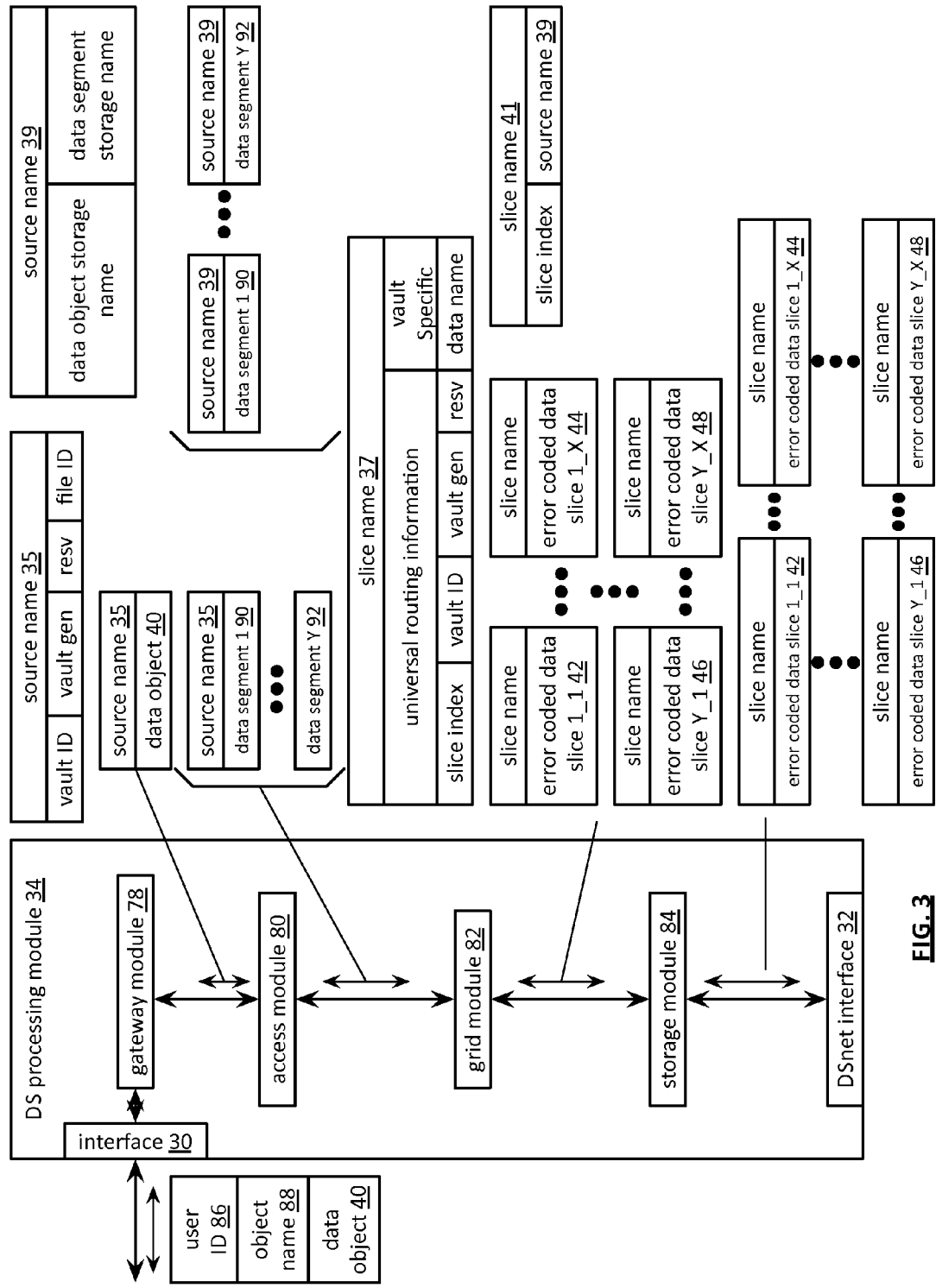
FIG. 3 is a schematic block diagram of an embodiment of a distributed storage processing unit in accordance with the invention.

FIG. 3 is a schematic block diagram of an embodiment of a dispersed storage (DS) processing module 34 (e.g., of user device 12 and/or of the DS processing unit 16). The DS processing module 34 includes a gateway module 78, an access module 80, a grid module 82, and a storage module 84. The DS processing module 34 may also include an interface 30 and a DSnet interface 32 or interfaces 68 and/or 70 may be part of user 12 or of DS processing unit 14. The DS processing module 34 may further include a bypass/feedback path between the storage module 84 to the gateway module 78. Modules 78-84 of the DS processing module 34 may be implemented in a single unit or distributed across multiple units.

In an example of storing data, the gateway module 78 receives an incoming data object that includes a user ID field 86, an object name field 88, and a data field 40 and may also receive corresponding information that includes one or more of a process identifier (e.g., an internal process/application ID), metadata, a file system directory, a block number, a transaction message, a user device identity (ID), a data object identifier, a source name, and/or user information. The gateway module 78 authenticates a user associated with the data object by verifying the user ID 86 with a DS managing unit 18 and/or another authenticating unit.

The gateway module 78 obtains user information from at least one of the DS managing unit 18, a user device, and/or the other authenticating unit when the user is authenticated. The user information includes one or more of a vault identifier, operational parameters, and user attributes (e.g., user data, billing information, etc.). The vault identifier (ID) identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the pillar width n (number of pillars X or slices per segment for this vault), a read threshold T, a decode threshold k, a write threshold, an encryption algorithm, a slicing parameter, a compression algorithm, an integrity check method, caching settings, parallelism settings, and/or other parameters that may be used to access the DSN memory layer.

The gateway module 78 utilizes the user information to generate a source name that will from now on correspond to the data object. A source name represents a virtual dispersed storage network (DSN) address that may be utilized to store and retrieve the data object within the DSN. The source name generation may be in accordance with one or more source name formats. In a first source name format, a source name 35 includes the vault ID field, a vault generation ID field, a reserved field, and a file ID field. In a second source name format, a source name 39 includes a data object storage name field and a data segment storage name field.

When the first source name format is utilized, the gateway module 78 generates the source name 35 of the data object 40 based on one or more of a user ID, the vault ID, a vault lookup, and the data object. For example, the gateway module 78 utilizes the user ID 86 to perform a lookup to retrieve the vault ID and vault generation ID, sets the reserved field to zero, and generates a file ID entry for the file ID field. For instance, the gateway module 78 generates the file ID by utilizing a hashing function on the data to produce a file ID entry for the file ID field. As another instance, the gateway module 78 generates the file ID as a random number to produce the file ID entry for the file ID field. The gateway module 78 may also perform message conversion, protocol conversion, electrical conversion, optical conversion, access control, user identification, user information retrieval, traffic monitoring, statistics generation, configuration, management, and/or source name determination.

When the second source name format is utilized, the gateway module 78 generates the source name 39 of the data object 40 based on one or more of the user ID, the vault ID, a vault lookup, an available filename list (e.g., for the data storage name field), and an available segment number list (e.g., for the data segment storage name field). For example, the gateway module 78 selects available filename to establish a data storage name entry for the data storage name field and selects an initial segment number of zero as a data segment storage name entry for the data segment storage name field. A DS unit 36 may subsequently utilize the source name 39 to directly store and retrieve encoded data slices in a memory associated with the DS unit 36 without a data name to memory storage address location lookup by utilizing the data object storage name as a local filename and the data segment storage name as an offset within the local filename. The gateway module 78 to generate a new directory entry, wherein the directory entry is utilized to correlate the object name 88 with the source name 35 or the source name 39. For example, the gateway module 78 generates the new directory entry to include object name 88 and a first source name 39 of a plurality of source names 39 associated with the plurality of data segments 1-Y.

The access module 80 receives the data object 40 and divides the data object 40 to produce a plurality of data segments 1 through Y 90-92 in accordance with a data storage protocol (e.g., file storage system, a block storage system, and/or an aggregated block storage system). A number of segments Y may be predetermined or randomly assigned based on a selected segment size and the size of the data object. For example, if the number of segments is predetermined to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, when segment sized is fixed, the number of segments Y varies based on the size of data object. For instance, if the data object is an image file of 4,194,304 bytes and the fixed size of each segment is 4,096 bytes, the then number of segments Y=1,024. Each data segment is associated with the same source name when source name 35 is utilized. Each data segment is associated with a slightly different source name when source name 39 is utilized. For example, the data object storage name field remains constant for the plurality of data segments and the data segment storage name field is incremented by one for each successive segment of the plurality of data segments.

The grid module 82 receives the plurality of data segments from the access module 80 and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X encoded data slices 42-44.

The value X, or the number of pillars (e.g., X=16), is chosen as a parameter of the error coding dispersal storage function. Other error coding dispersal function parameters include a read threshold T, a decode threshold k, a write threshold W, etc. The decode threshold (e.g., k=10, when X=16) corresponds to the minimum number of error-free error coded data slices required to reconstruct the data segment. The DS processing module 34 can compensate for X-k (e.g., 16−10=6) missing error coded data slices per data segment. The write threshold W corresponds to a minimum number of DS storage units that acknowledge proper storage of their respective data slices before the DS processing module indicates proper storage of the encoded data segment. The write threshold is greater than or equal to the decode threshold for a given number of pillars (X).

For each encoded data slice of a data segment, the grid module 82 generates a corresponding unique slice name. The slice name generation may be in accordance with one or more slice name formats. In a first slice name format, slice name 37 includes a universal routing information field and a vault specific field and may be 48 bytes (e.g., 24 bytes for each of the universal routing information field and the vault specific field). As illustrated, the universal routing information field includes a slice index (e.g., indicating a pillar number), the vault ID, the vault generation, and the reserved field. The slice index is based on the pillar number and the vault ID and, as such, is unique for each pillar (e.g., slices of the same pillar for the same vault for any segment will share the same slice index). The vault specific field includes a data name, which includes the file ID and a segment number (e.g., a sequential numbering of data segments 1-Y of a simple data object or a data block number). In a second slice name format, slice name 41 includes the slice index and the source name 39 when the source name 39 format is utilized. Alternatively, slice name 41 also includes the data name and/or the segment number.

Prior to outputting the error coded data slices of a data segment, the grid module 82 may perform post-slice manipulation on the slices. If enabled, the manipulation includes slice level compression, encryption, CRC, addressing, tagging, and/or other manipulation to improve the effectiveness of the computing system.

When the error coded data slices of a data segment of the plurality of data segments are ready to be outputted, the grid module 82 determines which of the DS storage units 36 will store the encoded data slices based on a dispersed storage memory mapping associated with the user's vault and/or DS storage unit attributes. The DS storage unit attributes includes one or more of availability, self-selection, performance history, link speed, link latency, ownership, available DSN memory, domain, cost, a prioritization scheme, a centralized selection message from another source, a lookup table, data ownership, and/or any other factor to optimize the operation of the computing system. In an implementation example, the number of DS storage units 36 is equal to or greater than the number of pillars (e.g., X) so that no more than one error coded data slice of the same data segment is stored on the same DS storage unit 36. Encoded data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y and associated slice names to the DS storage units 36 for storage therein. Each of the DS storage units 36 stores corresponding encoded data slices and maintains a local virtual DSN address to physical location table to correlate the virtual DSN address of the encoded data slice(s) to physical storage addresses within the DS unit 36.

In an example of a read operation, the user device 12-14 sends a read request to the DS processing module 34, which authenticates the request. When the request is authenticated, the DS processing 34 sends a read request to each of the DS storage units 36 storing slices of the data object. The slices are received via the DSnet interface 32 and processed by the storage module 84, which performs a parity check and provides the slices to the grid module 82 when the parity check is successful. The grid module 82 decodes the slices in accordance with the error coding dispersal storage function to reconstruct each data segment of the plurality of data segments. The access module 80 reconstructs the data object from the plurality data segments and the gateway module 78 formats the data object for transmission to the user device 12-14.

Figure 4:
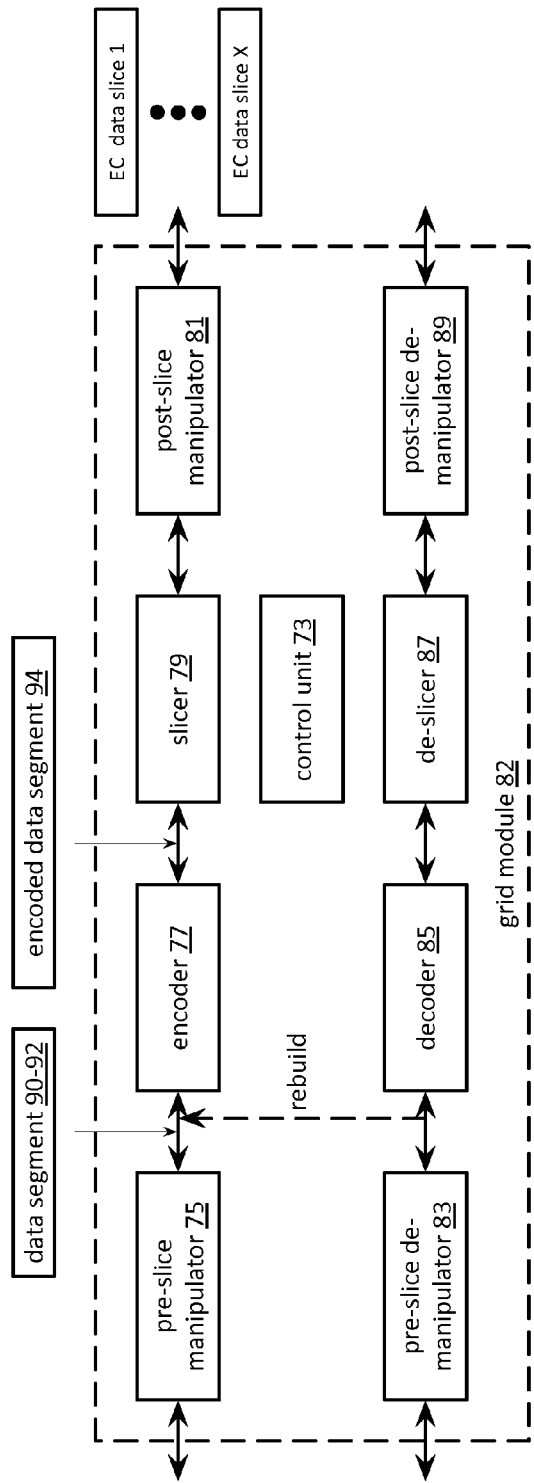
FIG. 4 is a schematic block diagram of an embodiment of a grid module in accordance with the invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/k, where X is the width or number of slices, and k is the decode threshold. In this regard, the corresponding decoding process can accommodate at most X-k missing encoded data slices and still recreate the data segment 92. For example, if X=16 and k=10, then the data segment 92 will be recoverable as long as 10 or more encoded data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the encoded data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of encoded data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

Figure 5:
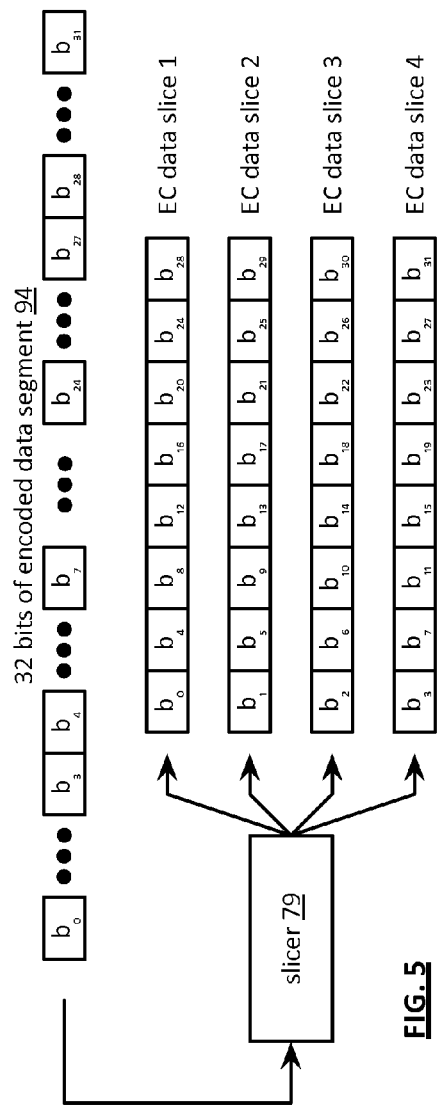
FIG. 5 is a diagram of an example embodiment of error coded data slice creation in accordance with the invention.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the encoded data slices in a pattern as shown. As such, each encoded data slice does not include consecutive bits of the data segment 94 reducing the impact of consecutive bit failures on data recovery. For example, if encoded data slice 2 (which includes bits 1, 5, 9, 13, 17, 25, and 29) is unavailable (e.g., lost, inaccessible, or corrupted), the data segment can be reconstructed from the other encoded data slices (e.g., 1, 3 and 4 for a read threshold of 3 and a width of 4).

Figure 6:
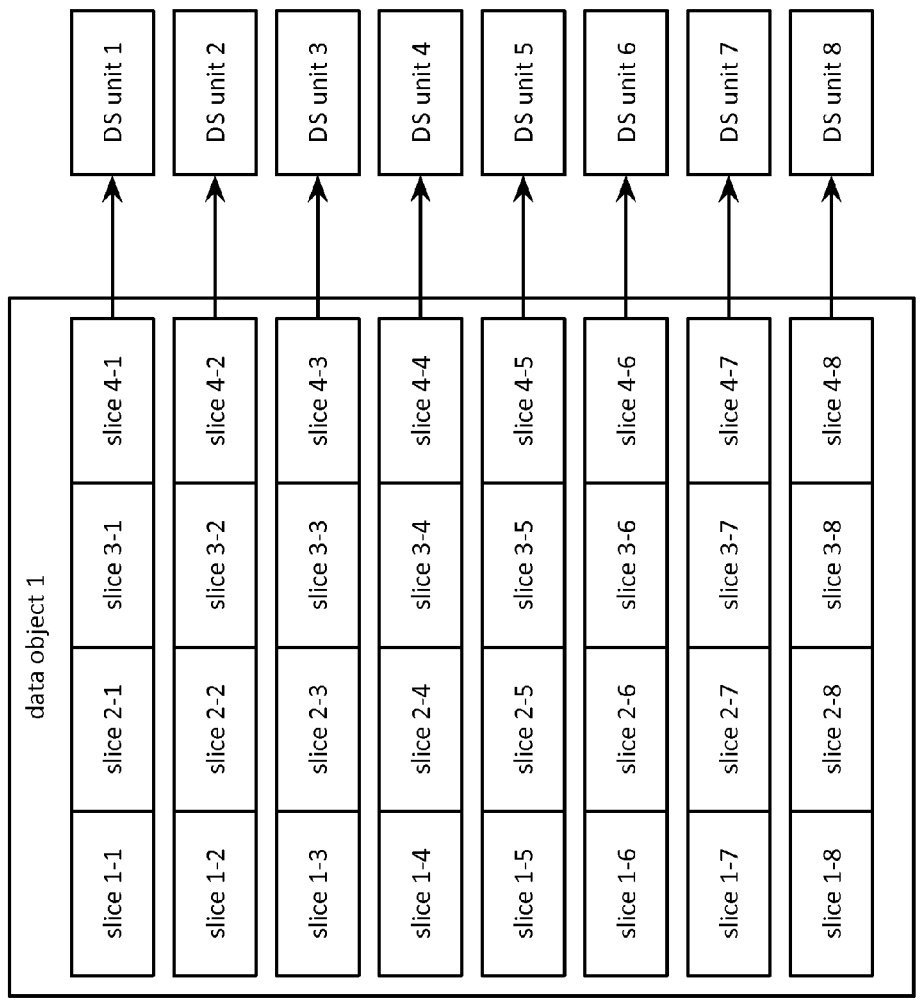
FIG. 6 is a diagram illustrating an encoded data slice batch mapping to a plurality of dispersed storage units in accordance with the invention.

FIG. 6 is a diagram illustrating an encoded data slice batch mapping to a plurality of dispersed storage units. A data object 1 is stored in a dispersed storage network (DSN) memory that includes dispersed storage (DS) units 1-8. For example, a DS processing module dispersed storage error encodes data object 1 to produce 4 sets of encoded data slices, wherein each set of encoded data slices includes 8 encoded data slices when a pillar which is 8, a decode threshold is 5, and data object 1 includes a number of bytes that produces the 4 sets of encoded data slices. As such, the 4 sets of encoded data slices include 4 encoded data slices for each of 8 pillars.

The 4 sets of encoded data slices are sent to DS units 1-8 for storage therein in accordance with a slice transfer and storage approach. In a first slice transfer and storage approach, slice 1-1 is sent to DS unit 1 where DS unit 1 stores slice 1-1 in a local storage file associated with DS unit 1, slice 1-2 (e.g., segment 1, pillar 2) is sent to DS unit 2 where DS unit 2 stores slice 1-2 in a local storage file associated with DS unit 2, slice 1-3 (e.g., segment 1, pillar 3) is sent to DS unit 3 where DS unit 3 stores slice 1-3 in a local storage file associated with DS unit 3 . . . etc., slice 1-8 (e.g., segment 1, pillar 8) is sent to DS unit 8 where DS unit 8 stores slice 1-8 in a local storage file associated with DS unit 8; slice 2-1 (e.g., segment 2, pillar 1) is sent to DS unit 1 where DS unit 1 stores slice 2-1 in a local storage file associated with DS unit 1, slice 2-2 (e.g., segment 2, pillar 2) is sent to DS unit 2 where DS unit 2 stores slice 2-2 in a local storage file associated with DS unit 2, slice 2-3 (e.g., segment 2, pillar 3) is sent to DS unit 3 where DS unit 3 stores slice 2-3 in a local storage file associated with DS unit 3, . . . etc., slice 2-8 (e.g., segment 2, pillar 8) is sent to DS unit 8 where DS unit 8 stores slice 2-8 in a local storage file associated with DS unit 8; . . . etc., slice 4-1 (e.g., segment 4, pillar 1) is sent to DS unit 1 where DS unit 1 stores slice 4-1 in a local storage file associated with DS unit 1, slice 4-2 (e.g., segment 4, pillar 2) is sent to DS unit 2 where DS unit 2 stores slice 4-2 in a local storage file associated with DS unit 2, slice 4-3 (e.g., segment 4, pillar 3) is sent to DS unit 3 where DS unit 3 stores slice 4-3 in a local storage file associated with DS unit 3, . . . etc., slice 4-8 (e.g., segment 4, pillar 8) is sent to DS unit 8 where DS unit 8 stores slice 4-8 in a local storage file associated with DS unit 8. Each slice is stored in a unique local storage file when utilizing the first slice transfer and storage approach. As such, a memory write sequence is required for each slice. In a read operation, a memory read sequence is required for each slice.

In a second slice transfer and storage approach, slices 1-1, 2-1, 3-1, and 4-1 are sent to DS unit 1 where DS unit 1 stores the four slices together in a common local storage file associated with DS unit 1, slices 1-2, 2-2, 3-2, and 4-2 are sent to DS unit 2 where DS unit 2 stores the four slices together in a common local storage file associated with DS unit 2 . . . etc., slices 1-8, 2-8, 3-8, and 4-8 are sent to DS unit 8 where DS unit 8 stores the four slices together in a common local storage file associated with DS unit 8. Each group of slices sharing a common pillar number is stored in a unique local, and storage file when utilizing the second slice transfer and storage approach. As such, only a pillar width number (e.g., 8) of memory write sequences are required. In a read operation, only a pillar width number of memory read sequences is required.

Figure 7:
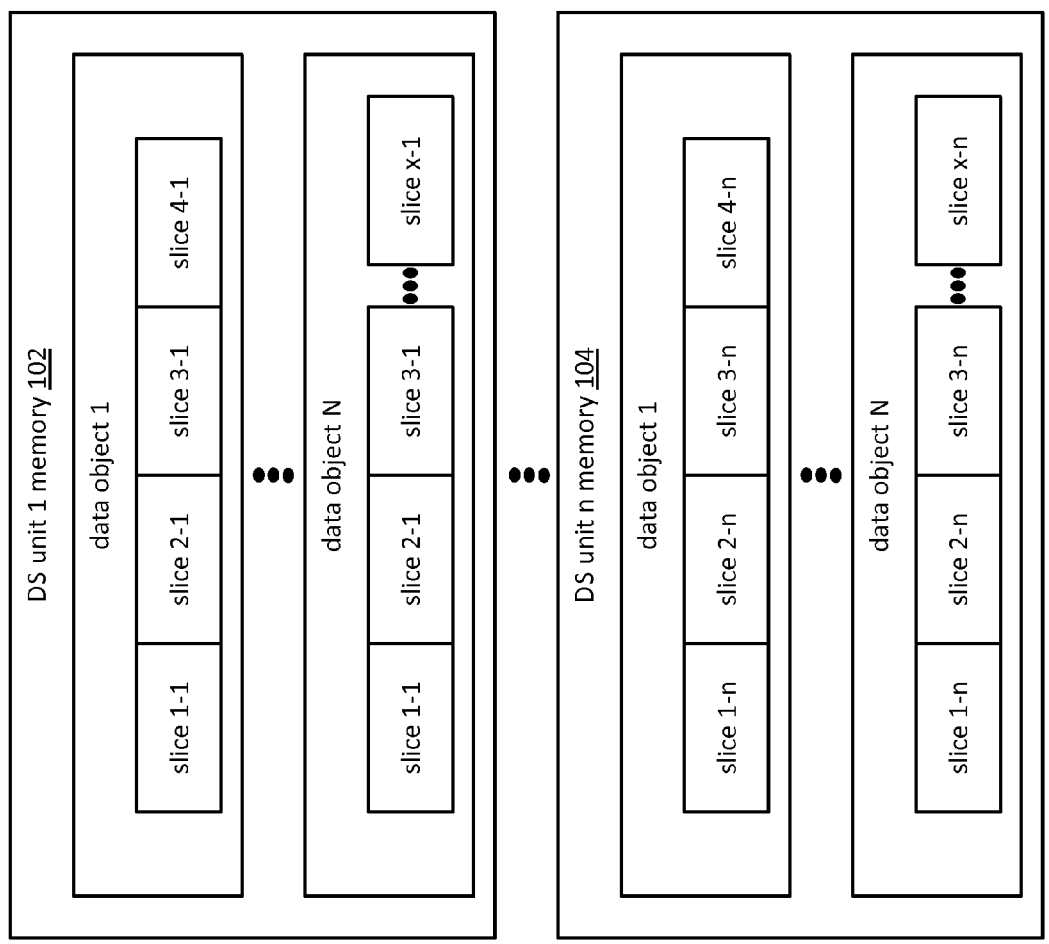
FIG. 7 is a diagram illustrating a memory mapping of a plurality of dispersed storage units in accordance with the invention.

FIG. 7 is a diagram illustrating a memory mapping of a plurality of dispersed storage units. The mapping includes a plurality of DS unit 1-n memory maps 102-104. Each DS unit memory 102-104 includes storage space for encoded data slices associated with a plurality of data objects 1-N. For example, DS unit 1 memory 102 stores pillar 1 encoded data slices 1-1, 2-1, 3-1, and 4-1 of data object 1 through encoded data slices 1-1, 2-1, 3-1, through x-1 of data object N. As another example, DS unit n memory 104 stores pillar n encoded data slices 1-n, 2-n, 3-n, and 4-n of data object 1 through encoded data slices 1-n, 2-n, 3-n, through x-n of data object N.

Figures 8, 9:
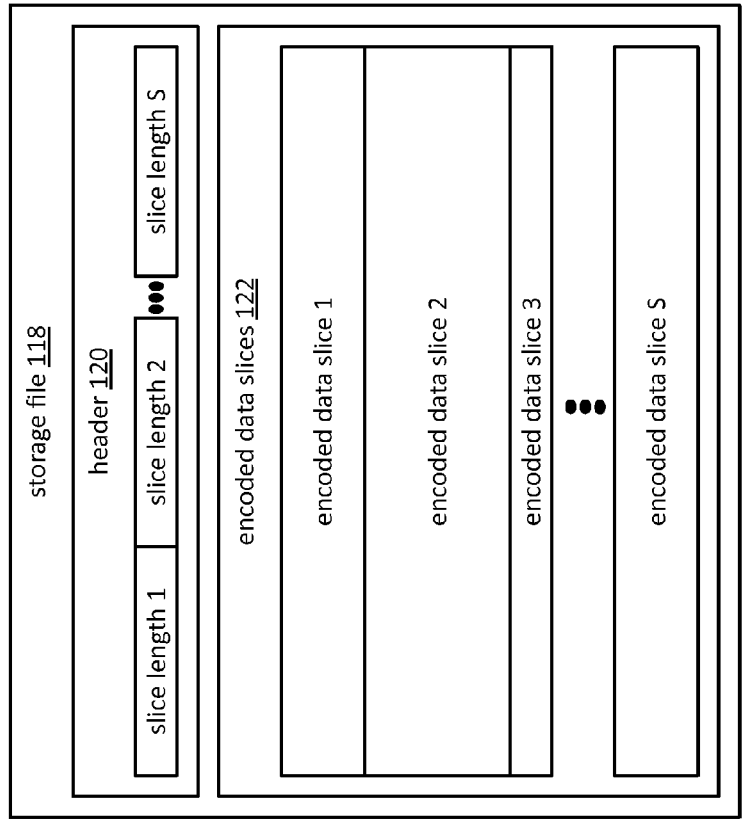
FIG. 8 is a diagram illustrating a source name structure in accordance with the invention.
FIG. 9 is a diagram illustrating a storage file structure in accordance with the invention.

FIG. 8 is a diagram illustrating a source name structure 39 that includes a fixed portion field 110 and a variable portion field 112. The fixed portion field 110 may be fixed with reference to a common data object being stored in a dispersed storage network (DSN) memory. The variable portion field 112 may be variable with reference to a plurality of data segments associated with the common data object being stored in the DSN memory. In an implementation example, the fixed portion field 110 includes a data object storage name entry 114, wherein the data object storage name entry 114 is associated with a file name of a dispersed storage (DS) unit file that is utilized to store encoded data slices associated with the source name 39. In the implementation example, the variable portion field 112 includes a data segment storage name entry 116, wherein the data segment storage name entry 116 is associated with a segment identifier of a plurality of data segments generated from the data object and may be utilized as a storage and retrieval offset within the file of the filename in the DS unit that is utilized to store the encoded data slices associated with the source name 39. In an example, 256 unique data segment storage names 116 are available when the fixed portion field 110 includes 15 bytes, the variable portion field 112 includes 1 byte and the source name 39 is 16 bytes.

FIG. 9 is a diagram illustrating a storage file structure 118 that includes a header field 120 and an encoded data slices field 122. The storage file structure 118 may be utilized by a dispersed storage (DS) unit to store a plurality of encoded data slices into a common storage file. The header field 120 includes a plurality of slice length indicators 1-S, wherein each slice length indicator includes a number of bytes associated with an encoded data slice stored within the storage file. In an implementation example, successive slice length indicators are associated with successive encoded data slices stored within the encoded data slices field 122. A number of slice length indicators S is substantially equivalent to a number of permutations of a data segment storage name 116. For example, 256 slice length indicators result when a variable portion field 112 is one byte that includes the data segment storage name 116. Alternatively, or in addition to, the header field 120 may include one or more of a direct offset to an encoded data slice, a direct access address to an encoded data slice, and an availability flag (e.g., −1=available for storing an encoded data slice).

The encoded data slices field 122 includes storage space for a plurality of encoded data slices 1-S. Each encoded data slice 1-S may be of a different length. In an example of a storage operation, a write request is received by a DS unit, wherein the request includes an encoded data slice and an associated slice name. The DS unit extracts a data object storage name 114 and a data segment storage name 116 from the slice name. The DS unit accesses the storage file 118 utilizing the data object storage name and extracts the header 120. The DS unit determines a storage location offset within the storage file based on the data segment storage name and the header. For example, the DS unit sums the slice length values of each slice length corresponding to encoded data slices less than the data segment storage name to produce a storage location offset. The DS unit modifies the storage file to include the encoded data slice utilizing the storage location offset and adds a new slice length indicator to the header 120 before storing the storage file 118 to the memory of the DS unit.

In another example of operation, a write request is received by the DS unit, wherein the request includes four encoded data slices and four associated slice names. The DS unit extracts the data object storage name and four data segment storage names from the four slice names.

The DS unit accesses the storage file 118 utilizing the data object storage name and extracts the header 120. The DS unit determines a storage location offset for each of the four encoded data slices within the storage file based on the four data segment storage names and the header. For example, the DS unit sums the slice length values of each slice length corresponding to encoded data slices less than the data segment storage name to produce a storage location offset. The DS unit modifies the storage file to include the four encoded data slices utilizing the four storage location offsets and adds four slice lengths to the header 120 before storing the storage file 118 to the memory of the DS unit.

As another example of operation, a read request is received by the DS unit, wherein the request includes five slice names. The DS unit extracts the data object storage name and five data segment storage names from the five slice names. The DS unit retrieves the storage file utilizing the data object storage name and extracts the header. The DS unit determines a retrieval location offset for each of five encoded data slices to be retrieved based on a five data segment storage names and the header. The DS unit extracts the five encoded data slices from the storage file utilizing the five retrieval location offsets. The DS unit sends the five encoded data slices to a requesting entity.

Figure 10:
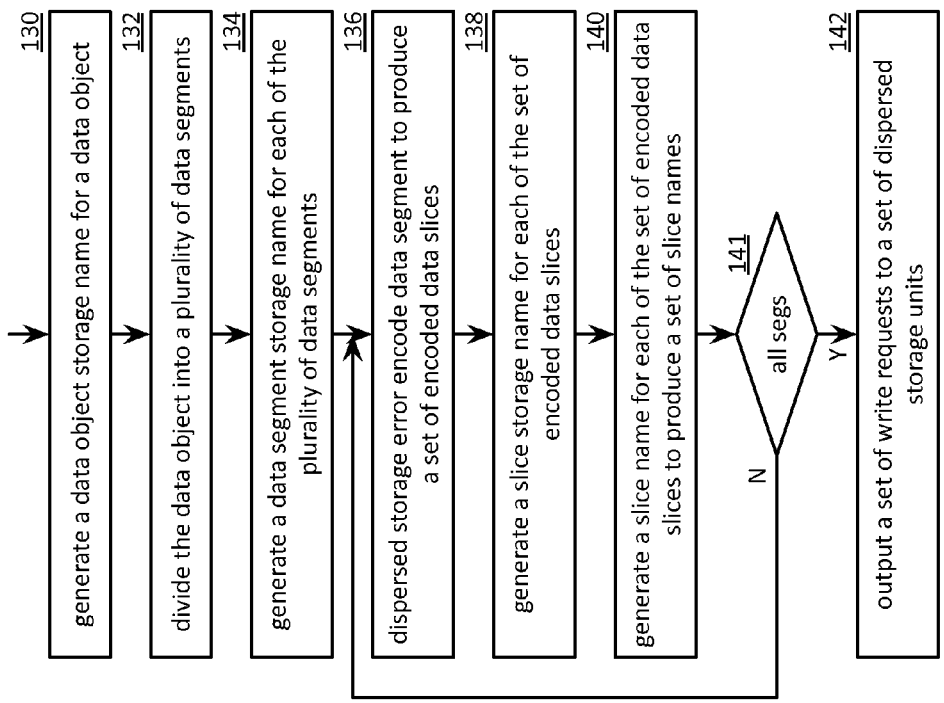
FIG. 10 is a flowchart illustrating an example of generating a set of write requests in accordance with the invention.

FIG. 10 is a flowchart illustrating an example of generating a set of write requests. The method begins with step 130 where processing module (e.g. of a dispersed storage (DS) processing unit) generates a data object storage name for a data object to be stored in a dispersed storage network (DSN) memory. The data object storage name includes at least one of a source identification code, a vault identification code, a file name, a data object name, and a user identification code. For example, the processing module generates a data object storage name of a file name associated with a set of dispersed storage (DS) units for storing encoded data slices. The generating the data object storage name includes determining whether the data object storage name exists, utilizing the data object storage name for the data object when the data object storage name does not exist (e.g., open the file when the files are open), determining that the data object corresponds to the data object storage name when the data object storage name exists, determining whether the storage file has available storage space when the data object corresponds to the data object storage name, and utilizing the data object storage name for the data object when the storage file has available storage space. The processing module generates a new data object storage name for the data object to use as the data object storage name when the data object corresponds to the data object storage name or the storage file does not have available storage space.

The method continues at step 132 where the processing module divides the data object into a plurality of data segments in accordance with error coding dispersal storage function parameters (e.g., data segment sizing). The method continues at step 134 where the processing module generates a data segment storage name for each of the plurality of data segments. For example, the processing module initializes the data segment storage name to zero for a first data segment and increments the data segment storage name by one for each successive data segment of the plurality of data segments.

The method continues at step 136 where the processing module dispersed storage error encodes a data segment of the plurality of data segments to produce a set of encoded data slices. The method continues at step 138 where the processing module generates a slice storage name for each of the set of encoded data slices (e.g., slice storage name includes a slice index corresponding to a pillar number of the encoded data slice). The method continues at step 140 where the processing module generates a slice name for each of the set of encoded data slices to produce a set of slice names, wherein the slice name includes the data object storage name, the data segment storage name, and the slice storage name. The method continues at step 141 where the processing module determines whether all data segments of the plurality of data segments have been processed. The method repeats back to step 136 when the processing module determines that all data segments have not been processed. The method continues to step 142 when the processing module determines that all data segments have been processed.

The method continues at step 142 where the processing module outputs a set of write requests to a set of DS units of the DSN, wherein a write request of the set of write requests includes a batch of encoded data slices and a corresponding batch of slice names, wherein the batch of encoded data slices includes encoded data slices that have slices names that have the data object storage name, a common slice storage name, and a different data segment storage name such that a DS unit of the set of DS units stores the batch of encoded data slices in a storage file.

Figure 11:
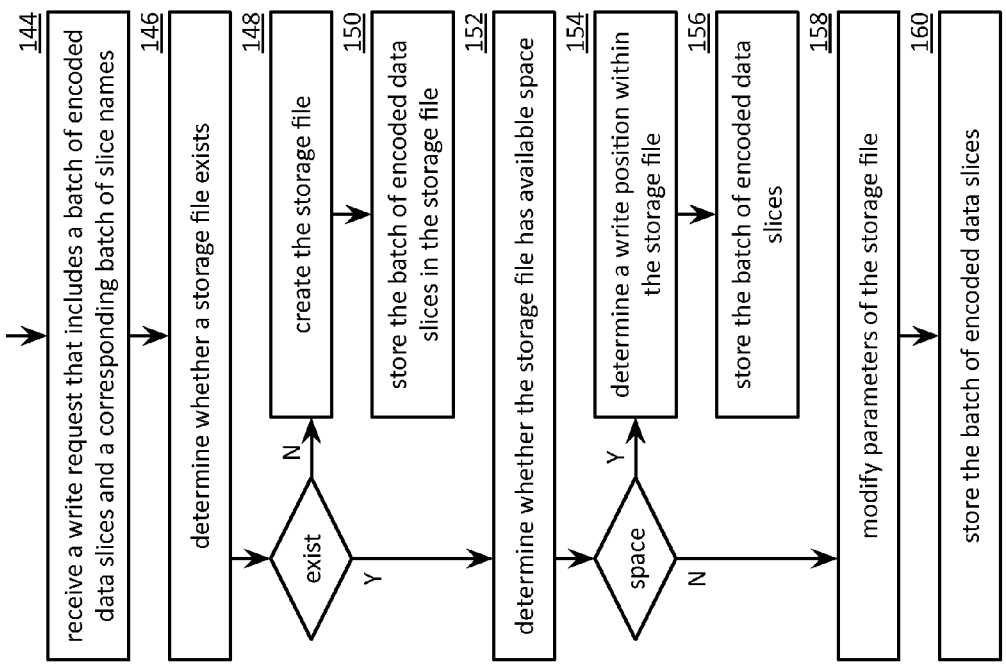
FIG. 11 is a flowchart illustrating an example of storing encoded data slices in accordance with the invention.

FIG. 11 is a flowchart illustrating an example of storing encoded data slices. The method begins with step 144 where processing module (e.g., of a dispersed storage (DS) unit) receives a write request that includes a batch of encoded data slices and a corresponding batch of slice names, wherein the batch of encoded data slices includes encoded data slices that have slices names that have a common data object storage name, a common slice storage name, and a different data segment storage name. The method continues at step 146 where the processing module determines whether a storage file exists based on the common data object storage name. For example, the processing module determines that the storage file does not exist when an error message occurs when attempting to read the storage file.

The method branches to step 152 when the processing module determines that the storage file exists. The method continues to step 148 when the processing module determines that the storage file does not exist. The method continues at step 148 where the processing module creates the storage file based on the common data object storage name. The creating the storage file includes initializing the storage file and determining a write position within the storage file based on at least one of a sum of each slice length corresponding to each previously stored encoded data slice based on the data segment storage name and a sum of a last write position and a slice length of a last written encoded data slice. The method continues at step 150 where the processing module stores the batch of encoded data slices in the storage file based on the corresponding batch of slice names.

The method continues at step 152 where the processing module determines whether the storage file has available storage space when the processing module determines that the storage file exists. For example, a processing module determines that the storage file has available storage space when a number of encoded data slices of the batch of encoded data slices is less than or equal to a number of available storage locations of the storage file (e.g., number of unoccupied slice length fields of a header of the storage file is greater than or equal to the number of encoded data slices). The method branches to step 158 when the processing module determines that the storage file does not have available space. The method continues to step 154 when the processing module determines that the storage file has available space.

The method continues at step 154 where the processing module determines a write position within the storage file when the storage file has available storage space (e.g., based on variable portion, size of last slices written to same file). The method continues at step 156 where the processing module stores the batch of encoded data slices based on the write position.

The method continues at step 158 where the processing module modifies parameters of the storage file when the storage file does not have available storage space. The modifying the parameters of the storage file includes modifying one or more of a revision number, a checksum, integrity information, the slice name, the source name, a user identifier, a file name, a slice length corresponding to the encoded data slice, and a storage file identifier. The method continues at step 160 where the processing module stores the batch of encoded data slices in accordance with the modified parameters (e.g., by changing a variable portion size, by deleting or overwriting old encoded slices, by adding an offset into the header, by adding a slice length of the encoded data slice to storage file header, by adding an absolute address to header).

Figure 12:
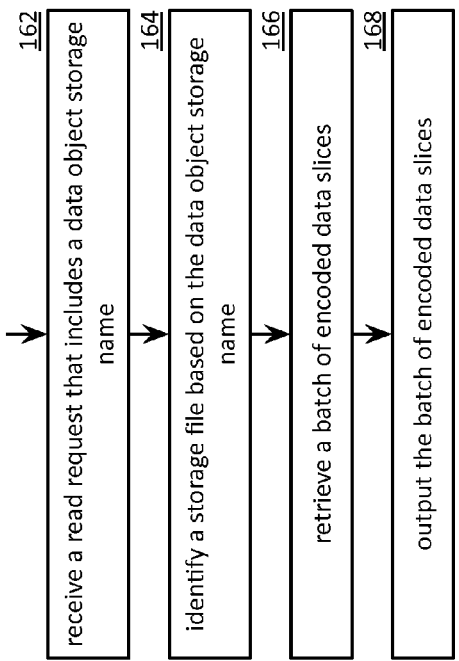
FIG. 12 is a flowchart illustrating an example of retrieving encoded data slices in accordance with the invention.

FIG. 12 is a flowchart illustrating an example of retrieving encoded data slices. The method begins with step 162 where processing module (e.g. a dispersed storage (DS) unit) receives a read request that includes a data object storage name. The method continues at step 164 where the processing module identifies a storage file based on the data object storage name (e.g., by directly utilizing the data object storage name, by translating the data object storage name by local storage file name utilizing a table lookup).

The method continues at step 166 where the processing module retrieves a batch of encoded data slices and a corresponding batch of slice names from the storage file, wherein the batch of encoded data slices includes encoded data slices that have slices names that have the data object storage name, a common slice storage name, and a different data segment storage name. Alternatively, the processing module may only retrieve the batch of encoded data slices. The retrieving the batch of encoded data slices includes determining a read position within the storage file (e.g., based on size of previously written slices, variable portion) and retrieving an encoded data slice of the batch of encoded data slices from the storage file based on the read position. The determining the read position includes at least one of a sum of each slice length corresponding to each previously stored encoded data slice based on the different data segment storage name and a sum of a last read position and a slice length of a last read encoded data slice. The method continues at step 168 where the processing module outputs the batch of encoded data slices. In addition, the processing module may output the corresponding batch of slice names.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by one or more processing modules of a computing device to access a data object in a dispersed storage network (DSN), the method comprises:

receiving an access request for the data object;

ascertaining that the data object is divided into a plurality of data segments, wherein the plurality of data segments are dispersed storage error encoded to produce a plurality of sets of encoded data slices, wherein a set of the plurality of sets of encoded data slices corresponds to a data segment of the plurality of data segments;

ascertaining batching of the plurality of sets of encoded data slices, wherein the plurality of sets of encoded data slices are arranged into a set of batched encoded data slices; and outputting a set of access requests for the set of batched encoded data slices to storage units of the DSN, wherein an access request of the set of access requests corresponds to one of the batched encoded data slices of the set of batched encoded data slices.

2. The method of claim 1 comprises:

receiving a write request as the access request; and in response to the write request:
  dividing the data object into the plurality of data segments;
  dispersed storage error encoding the plurality of data segments to produce the plurality of sets of encoded data slices;
  generating slice names for each encoded data slice of the plurality of sets of encoded data slices to facilitate the batching of the plurality of sets of encoded data slices into the set of batched encoded data slices; and
  outputting a set of DSN write requests to the storage units for the storing the set of batched encoded data slices.

3. The method of claim 2, wherein the generating the slices names comprises:

generating a data object name for the data object;

generating a plurality of data segment names for the plurality of data segments;

for each encoded data slices of a set of encoded data slices of the plurality of sets of encoded data slices:
  generating a slice number; and
  generating a slice name based on the slice number, one of the plurality of data segment names, and the data object name.

4. The method of claim 3, wherein the ascertaining batching of the plurality of sets of encoded data slices comprises:

grouping encoded data slices of the plurality of sets of encoded data slices based on the slice numbers to produce the set of batched encoded data slices.

5. The method of claim 1 comprises:

receiving a read request as the access request; and in response to the read request:
  accessing information regarding a storage file to determine that the data object is divided into the plurality of data segments and to identify the set of batched encoded data slices; and
  outputting a set of DSN read requests for the set of batched encoded data slices to the storage units of the DSN.

6. A computer comprises:

an interface;

a memory; and a processing module operably coupled to the interface and the memory, wherein the processing module is operable to:

receive, via the interface, an access request for the data object;

ascertain that the data object is divided into a plurality of data segments, wherein the plurality of data segments are dispersed storage error encoded to produce a plurality of sets of encoded data slices, wherein a set of the plurality of sets of encoded data slices corresponds to a data segment of the plurality of data segments;

ascertain batching of the plurality of sets of encoded data slices, wherein the plurality of sets of encoded data slices are arranged into a set of batched encoded data slices; and output, via the interface, a set of access requests for the set of batched encoded data slices to storage units of the DSN, wherein an access request of the set of access requests corresponds to one of the batched encoded data slices of the set of batched encoded data slices.

7. The computer of claim 6, wherein the processing module is further operable to:

receive, via the interface, a write request as the access request; and in response to the write request:
divide the data object into the plurality of data segments;
dispersed storage error encode the plurality of data segments to produce the plurality of sets of encoded data slices;
generate slice names for each encoded data slice of the plurality of sets of encoded data slices to facilitate the batching of the plurality of sets of encoded data slices into the set of batched encoded data slices; and
output, via the interface, a set of DSN write requests to the storage units for the storing the set of batched encoded data slices.

8. The computer of claim 7, wherein the processing module is further operable to generate the slices names by:

generating a data object name for the data object;
generating a plurality of data segment names for the plurality of data segments;
for each encoded data slices of a set of encoded data slices of the plurality of sets of encoded data slices:
generating a slice number; and
generating a slice name based on the slice number, one of the plurality of data segment names, and the data object name.

9. The computer of claim 8, wherein the processing module is further operable to ascertain the batching of the plurality of sets of encoded data slices by:

grouping encoded data slices of the plurality of sets of encoded data slices based on the slice numbers to produce the set of batched encoded data slices.

10. The computer of claim 6, wherein the processing module is further operable to:

receive, via the interface, a read request as the access request; and in response to the read request:
access information regarding a storage file to determine that the data object is divided into the plurality of data segments and to identify the set of batched encoded data slices; and
output, via the interface, a set of DSN read requests for the set of batched encoded data slices to the storage units of the DSN.

* * * * *